US006787838B1

United States Patent
Chidambarrao et al.

(10) Patent No.: US 6,787,838 B1
(45) Date of Patent: Sep. 7, 2004

(54) TRENCH CAPACITOR DRAM CELL USING BURIED OXIDE AS ARRAY TOP OXIDE

(75) Inventors: Dureseti Chidambarrao, Weston, CT (US); Ramachandra Divakaruni, Ossining, NY (US); Deok-kee Kim, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,259

(22) Filed: Jun. 18, 2003

(51) Int. Cl.[7] .............................................. H01L 27/108
(52) U.S. Cl. ...................... 257/301; 438/242; 438/244; 438/243; 257/302
(58) Field of Search ................................ 438/242, 243

(56) References Cited

U.S. PATENT DOCUMENTS

| | | | | |
|---|---|---|---|---|
| 5,770,484 A | * | 6/1998 | Kleinhenz | 438/155 |
| 6,399,447 B1 | * | 6/2002 | Clevenger et al. | 438/268 |
| 6,566,177 B1 | * | 5/2003 | Radens et al. | 438/152 |
| 2002/0064913 A1 | * | 5/2002 | Adkisson et al. | 438/241 |

* cited by examiner

*Primary Examiner*—David Nelms
*Assistant Examiner*—Thao P. Le

(57) ABSTRACT

A trench capacitor DRAM cell in an SOI wafer uses the silicon device layer in the array as part of passing wordlines, stripping the silicon device layer in the array outside the wordlines and uses the BOX layer as the array top oxide separating the passing wordlines from the substrate.

8 Claims, 4 Drawing Sheets

TRENCH CAPACITOR DRAM CELL USING BURIED OXIDE AS ARRAY TOP OXIDE

BACKGROUND OF INVENTION

The field of the invention is that of integrated circuits having DRAM arrays of trench capacitor cells.

Dynamic Random Access Memory (DRAM) cells are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size determines chip density, size and cost, reducing cell area is one of the DRAM designer's primary goals. Reducing cell area is done, normally, by reducing feature size to shrink the cell.

Besides shrinking the cell features, the most effective way to reduce cell area is to reduce the largest feature in the cell, typically, the area of the storage capacitor. Unfortunately, the capacitor plate area reduces capacitance and, consequently, reduces stored charge. Reduced charge means that what charge is stored in the DRAM is more susceptible to noise, soft errors, leakage and other well known DRAM problems. Consequently, another primary goal for DRAM cell designers is to maintain storage capacitance while reducing cell area.

One way to accomplish this density goal without sacrificing storage capacitance is to use trench capacitors in the cells. Typically, trench capacitors are formed by etching long deep trenches in a silicon wafer and, then, placing each capacitor on its side in the trench, orienting the capacitors vertically with respect to the chip's surface. Thus, the surface area required for the storage capacitor is dramatically reduced without sacrificing capacitance, and correspondingly, storable charge.

However, since using a trench capacitor eliminates much of the cell surface area, i.e., that portion of cell area which was formerly required for the storage capacitor, the cell's access transistor has become the dominant cell feature determining array area. As a result, to further reduce cell and array area, efforts have been made to reduce access transistor area, which include making a vertical access transistor in the capacitor trench. See, for example, U.S. Pat. No. 6,426,252 entitled "Silicon-On-Insulator Vertical Array DRAM Cell With Self-Aligned Buried Strap" and references cited in it.

Performance is equally as important as density to DRAM design. Silicon-on-insulator (SOI) has been used to decrease parasitic capacitance and hence to improve integrated circuit chip performance. SOI reduces parasitic capacitance within the integrated circuit to reduce individual circuit loads, thereby improving circuit and chip performance. However, reducing parasitic capacitance is at odds with increasing or maintaining cell storage capacitance. Accordingly, SOI is seldom used for DRAM manufacture. One attempt at SOI for DRAMS is taught in the cited patent.

Thus, there is a need for increasing the number of stored data bits per chip of Dynamic Random Access Memory (DRAM) products. There is also a need for improving DRAM electrical performance without impairing cell charge storage.

Referring now to the drawings, and more particularly, FIG. 7 shows a flow diagram of a prior art silicon-on-insulator (SOI) process for forming vertical DRAM cells in the cited patent. First, in step 100, a layered semiconductor wafer is prepared. Preferably, the initial wafer is a single crystal silicon wafer. A buried oxide (BOX) layer is formed in the silicon wafer. The BOX layer isolates a silicon layer (SOI layer) above the BOX layer from a thick substrate, which is much thicker than the silicon layer. Then, in step 102 deep trenches are formed, preferably, using a typical photolithographic and etch process. The deep trenches are formed through the silicon layer, the BOX layer and into the thicker substrate. A thin node dielectric layer is conformally formed on the wafer and along the deep trench sidewalls. After forming the thin node dielectric layer a capacitor plate is formed in step 104 in the deep trenches. Then, in step 106, the thin node dielectric layer is stripped from the SOI layer and the upper portion of the BOX layer sidewalls are recessed around the upper surface of each of the capacitor plates.

Next, in step 108, the recesses are filled with conductive strapping material. Then, in step 110, oxide is formed on the wafer and, especially, on top of the capacitor plate, i.e., trench top oxide (TTO) is formed. In step 112 excess TTO is stripped from the wafer surface. In step 114 the pad nitride layer is removed from the wafer surface and gate oxide is formed on the trench sidewalls. In step 116 access transistor gates are formed along the trench sidewalls and cells are defined using shallow trench isolation techniques. Finally, in step 118, cell definition is completed by defining device regions and device wells and forming bit lines and word lines. FIG. 8 illustrates a completed vertical DRAM cell in a deep trench according to the steps of FIG. 7. First, as noted above, the BOX layer 822 is formed in a single crystal silicon wafer. The BOX layer 822 separates the SOI silicon layer 824 from the remaining thicker silicon substrate 826. Although the BOX layer 822 is formed, preferably, using a high-dose oxygen ion implantation in the single crystal wafer, any other suitable SOI technique may be employed. The preferred BOX layer 822 thickness is 300 nm, but the BOX layer 822 may be 10 nm to 500 nm thick. BOX layer 822 thickness may be selected by adjusting ion implantation dose and energy. The SOI silicon layer 824, preferably, is 500 nm thick. However, the SOI layer 824 may be 100 nm to 1000 nm thick depending on the desired cell access transistor channel length and SOI layer 824 thickness may be adjusted using chemical vapor deposition (CVD) epitaxial growth. Having prepared the layered wafer, memory cells may be formed on the wafer or the wafer may be stored for future use.

Preferred embodiment DRAM cell formation continues by forming a pad layer of an insulating material such as silicon nitride (SiN) on the upper surface of silicon layer 824. The pad layer may be formed using low-pressure CVD (LPCVD), for example, to deposit a 10 nm to 500 nm, preferably 200 nm, thick SiN layer. Optionally, prior to forming the pad LPCVD SiN layer, a thin (2 nm to 10 nm, preferably 5 nm) thermal oxide layer (not shown) may be formed on the surface of SOI silicon layer 824.

Having prepared the wafer in step 100, deep trenches 820 are opened through the SOI layer 824, BOX layer 822 and into the substrate 826 in step 102. A hard mask layer (not shown) of boron silicate glass (BSG) is formed on the SiN pad layer. Alternatively, any suitable hard mask material such as undoped silicate glass (USG) may be used for the hard mask layer. The deep trenches are formed using a conventional photolithography technique to pattern the BSG hard mask layer and then the trenches are etched using an anisotropic dry technique, such as Reactive Ion Etch (RIE). Preferably, the deep trenches extend 6 $\mu$m into substrate 826 but, may extend 3 $\mu$m to 10 $\mu$m into the substrate 826.

The storage capacitor counter-electrode, i.e., the common capacitor plate surrounding the trench, is formed, preferably, by doping the substrate 824 with a relatively high concentration of an appropriate n-type dopant. Alternatively, the substrate may be un-doped and, after etching the trenches, the substrate 826 trench sidewalls may be doped appropriately and, the dopant is outdiffused into the substrate 826 to form the counter-electrode. After forming the trenches and, if necessary, the counter-electrode a thin (25–60 Angstrom) node dielectric layer 832 is formed, preferably an LPCVD SiN layer, which is the storage capacitor dielectric.

Next, in step 104, a capacitor plate 834 is formed in trenches. The capacitor plate 834 is formed by depositing a doped polysilicon (poly) layer using LPCVD, preferably doped with n-type dopant. Then, the doped polysilicon layer is planarized to the pad layer and recessed into the deep trench to a point beneath the SOI layer 824 and within the BOX layer 822, preferably, using an isotropic dry etch such as an SF6 plasma.

The thin node dielectric 832 is stripped from SOI and BOX trench sidewalls and, recesses are formed in the BOX that will be filled with conductive material to form straps 844. The thin node dielectric 832 is stripped from the trench sidewalls, preferably, using a wet etch such as hydrofluoric acid, which exposes SOI layer 824 sidewalls and the upper edge of BOX layer 822. Then, the exposed sidewall portion of BOX layer 822 is isotropically etched, preferably using a wet solution containing HF to form recesses beneath exposed sidewalls. The etch time is selected such that the oxide removal does not expose the top of substrate 826 and, the recess is contained within the BOX layer 822. Thus, the recesses are bounded at the top by SOI layer 824 and on one side by thin node dielectric layer 832 along upper end of trench capacitor plates 834. So, subsequent to forming the recesses, a wet strip is used to etch exposed thin node layer 832 material from within the recesses, exposing the upper end of trench capacitor plates 834 therein.

Next, an interfacial treatment of a thin dielectric surface layer (not shown), such as a 7 Angstrom oxide or nitride layer, is formed on SOI sidewalls 838, 840 and on the exposed upper surface 842 of polysilicon plate 834. This thin, 7 Angstrom dielectric interfacial treatment layer controls and limits the extent of outdiffusion from the polysilicon plate 834 into SOI layer 824. Thus, the thin dielectric interfacial treatment layer is not completely isolating, but is electrically conductive for electron tunneling along the side of polysilicon plate 834 and at the underside of SOI layer 824.

In step 108 a thin strap layer is deposited and excess strap material is removed leaving straps 844. The thin strap layer, which is of sufficient thickness to completely fill the recesses, preferably is 30 nm thick and may be 10–50 nm thick. The strap layer is formed using LPCVD to deposit the desired thickness of doped polysilicon. Then, the excess strap material is selectively removed from horizontal and vertical surfaces, the remaining polysilicon strap material forming straps 844. Any suitable selective wet etch or dry etch with selectivity to the interfacial treatment of the exposed SOI sidewalls may be used to remove the excess strap material. Thus, when dopant is subsequently outdiffused into SOI layer 824, the straps 844 form a self-aligned buried electrical connection between the trench polysilicon capacitor plate 834 and the SOI layer 824 thereabove.

In step 110 an oxide layer is formed on the wafer, forming trench-top-oxide (TTO) 848 on capacitor plates 834. Preferably, an anisotropic high density plasma (HDP) is used to deposit the TTO layer 848. HDP has a high deposition rate along the horizontal surfaces, and a slow deposition rate along vertical surfaces such as the sidewalls.

Then, excess surface oxide layer is removed from the pad SiN surface in step 112. Photoresist plugs are formed in trenches on TTO 848. Preferably, a photoresist layer is deposited and etched back such that only photoresist plugs remain in the trenches. The excess surface oxide is removed using an appropriate etch such as RIE. Then, the photoresist plugs are removed. Optionally, the excess surface oxide layer may be removed using a typical selective chemical mechanical polishing (CMP) step that is selective to nitride.

Next, the pad SiN is removed and gate oxide is formed in step 114. The pad SiN layer is removed using an appropriate etchant and a 5–20 nm sacrificial oxide layer, preferably 80 nm, is grown by thermal oxidation. The sacrificial oxide layer (not shown) repairs superficial surface damage that may have occurred in the exposed SOI layer 824 and sidewalls. Selected device regions are defined in the wafer and are doped using ion implantation. The sacrificial oxide layer is stripped using a hydrofluoric acid solution. Then, a 2–100 nm gate oxide layer, preferably 5 nm, is grown on the SOI layer 824 using thermal oxidation.

Cell access transistor formation is completed in step 116. A gate conductor (GC) 854 is formed, filling trenches, preferably, using LPCVD to deposit a polysilicon layer. A protective nitride pad layer (not shown) is deposited on the polysilicon layer. Then, a device isolation trench 856 is formed using a conventional shallow trench isolation (STI) process, such as conventional photolithography and dry etching, e.g., RIE. The RIE formed shallow trenches remove one deep trench sidewall and extends down through the SOI silicon layer 824, BOX layer 822 and into substrate 826. Thus, the shallow trenches 856, essentially, form isolated silicon islands of SOI layer 824 on BOX layer 822 with a gate conductor 854 remaining along one sidewall 838, thereby forming each cell's access gate. Then, the shallow trenches 856 are filled with a dielectric material such as silicon dioxide using a process such as an anisotropic HDP deposition. Then, the surface is planarized to the protective SiN pad surface using a conventional CMP process. The protective SiN pad is stripped from the wafer using a standard wet etch. A polysilicon wordline layer is formed on the surface in contact with the gate conductor 854 and patterned, using lithography and dry etching.

SUMMARY OF INVENTION

The invention relates to a DRAM cell formed in an SOI substrate and having a trench capacitor and a vertical transistor.

A feature of the invention is the location of the vertical transistor below the BOX and entirely within the silicon substrate.

Another feature of the invention is the use of the BOX as the insulator that isolates the adjacent wordline (the passing wordline) from the silicon area next to the transistor body.

DETAILED DESCRIPTION

Figure 1:
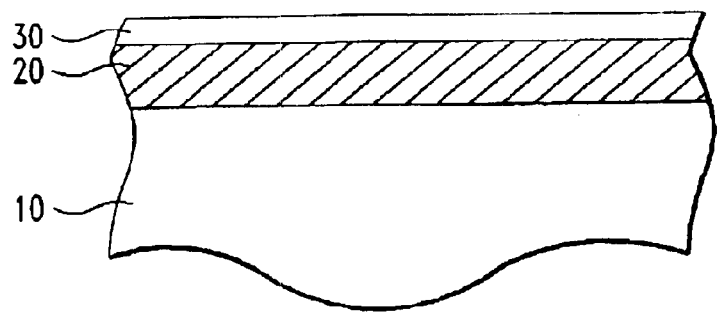
FIG. 1 shows a cross section of an SOI wafer used for the invention.

FIG. 1 shows a section of an SOI (Silicon On Insulator) wafer having a wafer bulk substrate 10 upon which insulating layer 20 has been formed, separating the bulk silicon from the device layer 30 that contains the logic devices that make up the circuit. Layer 20 is conventionally made of oxide and is referred to as the Buried OXide layer (BOX).

The advantages of SOI circuits with respect to reducing the capacitance between the devices and the substrate are well known. DRAM cells having horizontal (planar) transistors formed in the device layer have been designed.

In the case of a DRAM or embedded DRAM array having vertical transistors, the upper layers, i.e. the device layer and the BOX are not needed and must be removed or otherwise rendered non-interfering.

The cited patent discusses a method of adapting the BOX to the uses of the cell, but that disclosure does not have a passing wordline structure and therefore does not need to insulate the passing wordline from the silicon substrate to avoid creating a parasitic transistor.

Figure 2:
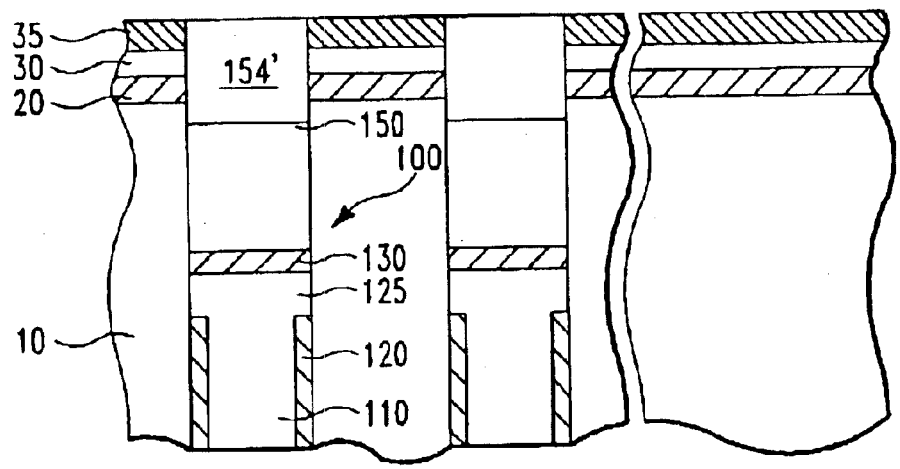
FIG. 2 shows a cross section of a wafer with a portion of the DRAM array on the left and a portion of the logic section of the wafer on the right.

FIG. 2 shows a cross section of part of a DRAM array on the left and a portion of the area of the support circuitry or the logic circuitry in the case of an embedded DRAM macro on the right. At the top of the Figure, a pad layer 35 comprising a conventional pad oxide and pad nitride has been put down. This Figure shows the array after preliminary steps of etching the trenches, forming the capacitors with a center electrode 110 and a collar oxide 120 that is needed to avoid creating a parasitic transistor. An outer buried plate in the substrate that completes the capacitor and a node dielectric are not shown in the Figure. Horizontal area 130 represents trench top oxide (TTO), which isolates the pass transistor from the trench capacitor. The area 125 represents the buried strap poly that outdiffuses into the substrate 10 to form the buried strap.

Numeral 100 indicates generally the region of the vertical pass transistor, which is formed conventionally and is not indicated in detail as the methods of formation are well known to those skilled in the art.

Gate 150, within the trench, is the gate of the pass transistor. Above gate 150, an aperture 154' has been formed by recessing the poly that was used to fill the upper portion of the trench after preliminary steps in forming the transistors, such as performing an angled threshold implant to set the threshold voltage of the transistor and growing thermal oxide on the interior walls for the gate dielectric. Aperture 154' has been formed by recessing the poly used to fill the trench and to form gate 150. An angled threshold implant can be done through the aperture 154' to set the threshold voltage of the transistor.

Figure 3:
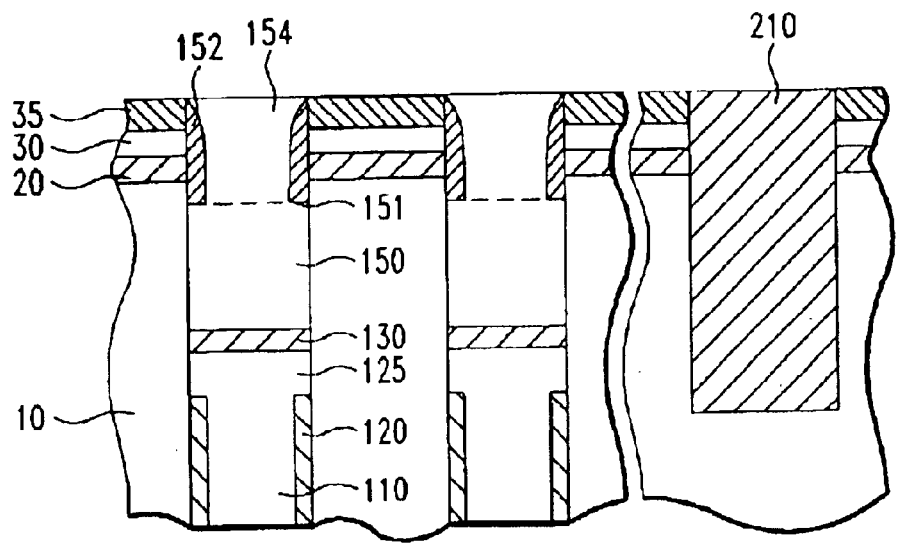
FIG. 3 shows the same area as FIG. 2 after the completion of the Deep Trench steps the filling of the isolation trenches.

FIG. 3 shows the result of forming nitride spacer 152 on the exposed walls of the aperture 154' and then filling the upper portion again with poly. The nitride spacer may be formed by depositing a SiN layer and etching using an anisotropic dry etch technique, such as Reactive Ion Etch (RIE). A 10 nm to 100 nm, preferably 55 nm, thick SiN layer is deposited for the nitride spacer using low-pressure CVD (LPCVD). The dividing line between the bottom of aperture 154' and the transistor gate 150 is indicated by dashed line 151. The leftover poly from filling the aperture and any leftover oxide has been polished in a CMP step, using pad nitride 35 as a polish stop.

On the right of the Figure, isolation trench (IT) 210 has been etched and filled with dielectric (oxide), with the excess also removed in a CMP operation. This is a conventional shallow trench isolation (STI) process, well known to those skilled in the art.

Figure 4:
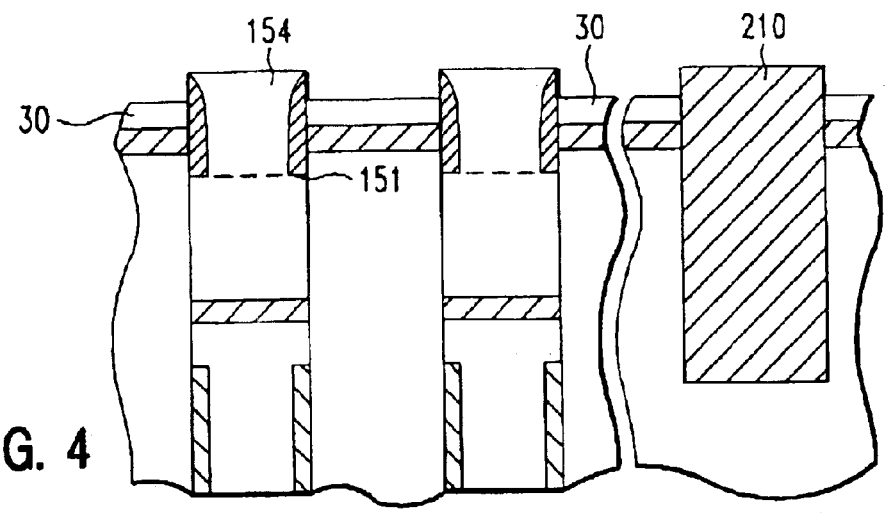
FIG. 4 shows the same area after stripping the pad nitride.

FIG. 4 shows the result of stripping the pad nitride 35, leaving the top of SOI layer 30 exposed. In following steps, the poly 154 will be the base for a gate/wordline structure that forms the gate contact to the vertical transistors 150 and also extends perpendicular to the plane of the paper to form one of the wordlines of the array. Between the two poly members 154, a second wordline, referred to as the "passing wordline" will be formed. This wordline makes contact to DRAM cells behind and in front of the plane of the paper a folded wordline architecture well known to those skilled in the art.

A problem with this passing wordline structure is that the wordline forms parasitic transistors in the silicon underneath it unless there is a dielectric that is sufficiently thick. Fabrication of such a dielectric in a cramped layout has a problem in the prior art that is solved by the present invention.

Figure 5:
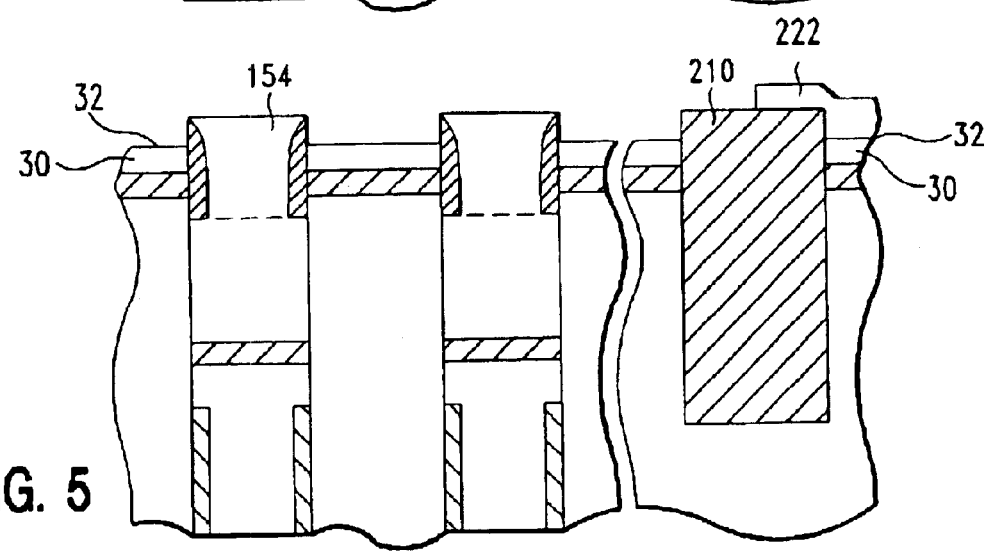
FIG. 5 shows the same area after deposition and removing the first layer of poly in the DRAM array on the left and patterning the first layer of poly in the logic.

FIG. 5 shows the result of a first step in putting down the first level interconnect/gate layer. A gate oxide film 32 has been grown on the top surface of silicon 30. A blanket film of poly (Poly 1) has been deposited to a nominal thickness of 70 nm. Poly 1 has been stripped in the array using a block mask that covers support and patterned in the supports to form gates 222, the gates of planar FETs. The reason for this step is that it is desired that the gate thickness in the supports be greater than that in the array. Thin poly for silicide formation is enough in the array because poly 154 provides a basis for gates and the SOI layer 30 in the array, while thick poly is needed in the supports for low gate resistance. Thin poly is desired in the array since low wordline to wordline/bitlines parasitic capacitance and hence a dense pitch can be achieved.

Figure 6:
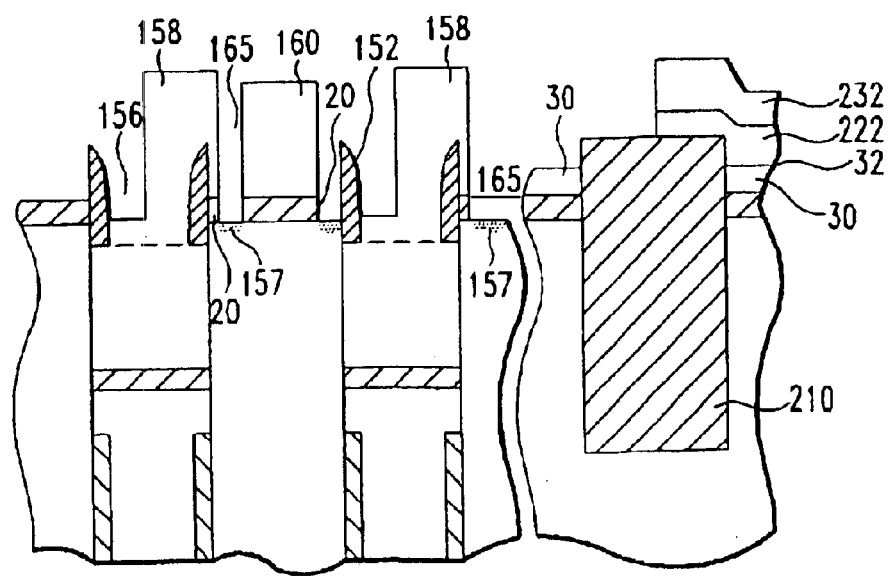
FIG. 6 shows the same area after deposition and patterning the second layer of poly, the first layer of poly, SOI layer, and BOX layer.
Figure 7:
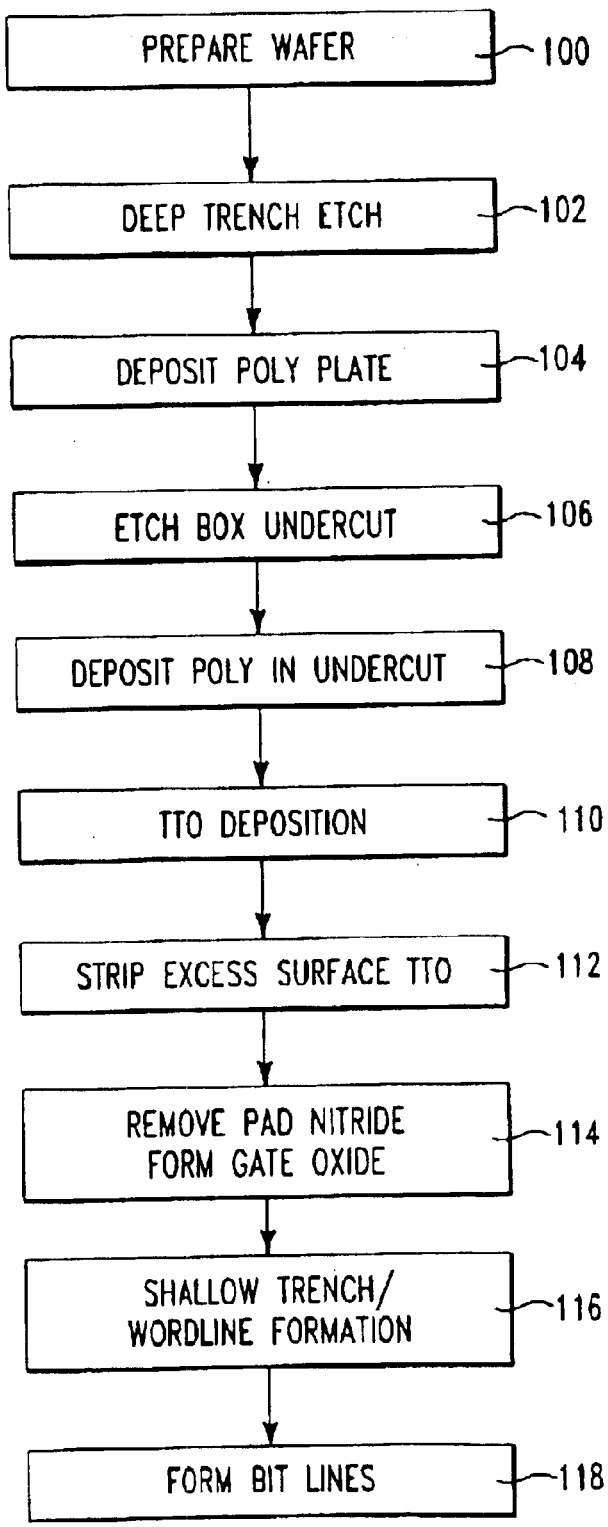
FIG. 7 shows a sequence in the prior art.
Figure 8:
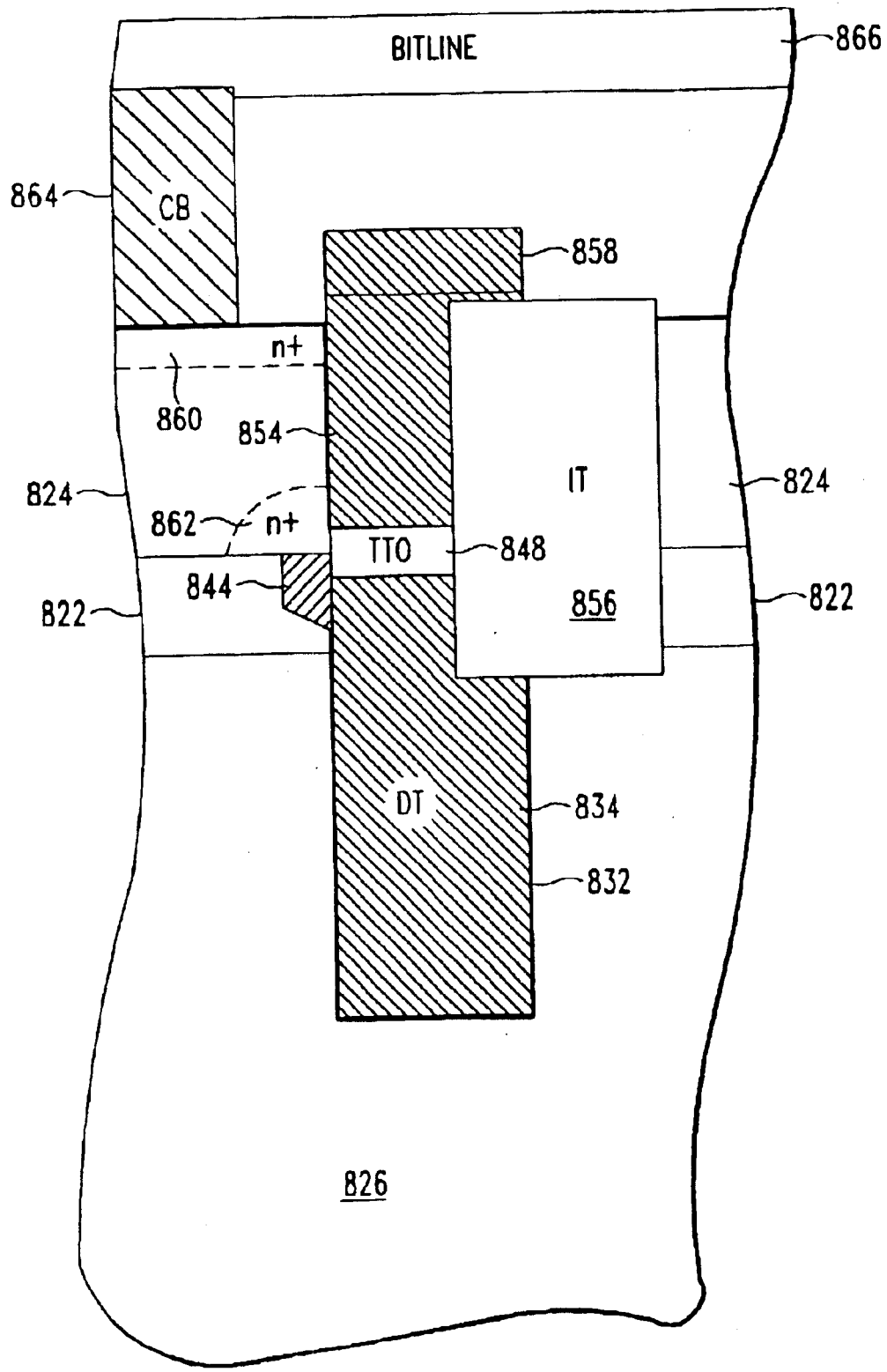
FIG. 8 shows a DRAM cell formed according to the sequence in FIG. 7.

FIG. 6 shows the result of additional steps in which a second layer of poly, Poly 2, has been put down and the first and the second layer of poly have been patterned with the same gate pattern in the support area and the second layer of poly has been patterned to form the gate contact/wordline structures in the array. In the array, the etching has continued after the Poly 2 has been etched, to etch the SOI layer 30 and the layer 20. An additional block mask to cover the supports is used while etching BOX layer 20 in the array. The result is a gate contact 158 on the cells in the plane of the paper and a passing wordline 160 between the gate contacts. BOX 20 forms an insulating layer (referred to as array top oxide) that isolates the wordline from the bulk silicon substrate. Both wordlines are isolated by the BOX, structure 158 having BOX insulation in front of and behind the plane of the paper.

With this approach, the thickness of the BOX is turned to an advantage, saving the need for depositing a sufficiently thick insulating layer to isolate the passing wordline.

On the right of the Figure, the Poly 1 and Poly 2 layer has have been patterned to form the gate stack of the logic transistors in the support area. Preferably, the logic gates in the array and support are patterned at the same time and the BOX layer 20 is etched using an additional block mask in a separate etching step, in order to avoid damage to the SOI layer while the SOI layer in the array and the BOX layer in the array are etched.

Optionally, a thin SiN layer can be deposited before Poly 2 deposition for a single crystal to poly interface through which electrical tunneling can occur (U.S. Pat. No. 6,429,101).

Speckled area 157 has been implanted to form S/D extensions that will be used as the bitline contacts to be formed in apertures 165 in subsequent steps. The nitride spacer 152 prevents wordlines to substrate shorting, and acts as an etch stop during gate conductor 158 etch.

In subsequent steps, the sidewalls of the gate stacks will be oxidized and processing will continue with standard logic processing.

Conventional interconnects will be formed to complete the circuit.

PROCESS SEQUENCE

Perform initial steps of preparing the substrate with the pad layer(s), blanket implants.

Etch the deep trench for the capacitors, form the buried plate, deposit the dielectric, fill the center electrode.

Recess the center electrode, form the collar oxide.

Form the buried strap.

Form the vertical transistor gate oxide.

Angled implant for VA (threshold voltage in vertical transistors) and XA (extension implants for bit line contacts).

Form spacers in DT above transistor, fill DT with poly, poly CMP.

Etch IT, IT fill, IT CMP.

Strip pad nitride.

Sac oxidation in array and support.

Array well and support implants.

Grow gate oxide in supports.

Blanket poly 1 deposit.

Litho for poly in support to define transistor gates. Block mask in the array.

Etch poly 1 in array and support.

Strip resist in supports.

Remove gate oxide layer in array.

(Optional thin SiN for single crystal to poly interface (U.S. Pat. No. 6,429,101)).

Blanket Poly 2 deposit.

Litho gates in array and supports.

Etch gate stack in array and supports (etch poly 1 and poly 2 in support, poly 2 and SOI in array).

Strip resist in array.

Etch BOX in array using a block mask that covers support.

Sidewall oxidation on gate stacks in array and supports.

Extension implants (XA) in array for bitline contacts (if not done previously).

Continue with standard logic process.

It should be noted that the preferred embodiment is described herein with devices and regions being doped for a particular device type, i.e. n-type FETs (NFETs). The described device type is for example only and not intended as a limitation. A person of ordinary skill are aware how to replace NFETs with p-type FETs (PFETs) and n-type dopant with p-type dopant where appropriate without departing from the spirit or scope of the invention.

Those skilled in the art will realize that the invention can be applied to integrated circuits that are drams and to integrated circuits that include DRAM arrays as well as a set of logic transistors that carry out a circuit function addition to the support functions associated with DRAMS. Both types of logic transistors will be referred to as support and/or the logic.

While the invention has been described in terms of a single preferred embodiment, those skilled in the art will recognize that the invention can be practiced in various versions within the spirit and scope of the following claims.

What is claimed is:

1. An integrated circuit comprising a DRAM array in an SOI wafer comprising:

an SOI substrate having a device layer of silicon separated from a bulk substrate by a BOX layer, said device layer comprising an array area and a logic area outside the array area;

a set of deep trenches in the array area having capacitors formed therein;

a set of vertical transistors in the array disposed below the BOX; and a set of gate/wordline structures in the array arranged with wordlines insulated from the substrate by a dielectric.

2. An integrated circuit according to claim 1, in which the vertical transistors have upper electrodes formed below the BOX and connected through apertures formed in the BOX to interconnect members.

3. An integrated circuit according to claim 1, in which portions of the BOX in the array remain below wordline structures, thereby isolating the wordline structures from the substrate.

4. An integrated circuit according to claim 2, in which portions of the BOX in the array remain below wordline structures, thereby isolating the wordline structures from the substrate.

5. An integrated circuit according to claim 1, in which the array is connected with passing wordlines, whereby alternate wordlines make contact to the gates of vertical transistors and pass over upper electrodes formed below the BOX and connected through apertures formed in the BOX to interconnect members that extend vertically between adjacent wordlines.

6. An integrated circuit according to claim 5, in which portions of the BOX in the array remain below wordline structures, thereby isolating the wordline structures from the substrate.

7. An integrated circuit according to claim 1, in which a set of logic gates are formed from a second layer of poly deposited on a first layer of poly and having a combined poly thickness.

8. An integrated circuit according to claim 7, in which a set of call gate contacts are formed from the second layer of poly deposited on gate electrode and having a gate contact poly thickness less than the combined thickness.

* * * * *